United States Patent [19]

Magdo et al.

[11] 4,005,471
[45] Jan. 25, 1977

[54] SEMICONDUCTOR RESISTOR HAVING A HIGH VALUE RESISTANCE FOR USE IN AN INTEGRATED CIRCUIT SEMICONDUCTOR DEVICE

[75] Inventors: Ingrid E. Magdo; Steven Magdo, both of Hopewell Junction, N.Y.

[73] Assignee: International Business Machines Corporation, Armonk, N.Y.

[22] Filed: Mar. 17, 1975

[21] Appl. No.: 559,276

[52] U.S. Cl. .................................. 357/51; 357/58; 357/88; 357/91; 338/320
[51] Int. Cl.² ................ H01L 27/02; H01L 29/12; H01H 37/38; H01H 37/40
[58] Field of Search ................ 357/13, 51, 58, 81, 357/91; 338/320

[56] References Cited

UNITED STATES PATENTS

| | | | |
|---|---|---|---|
| 3,729,662 | 4/1973 | Langdon | 357/51 |
| 3,761,786 | 9/1973 | Imaizumi et al. | 357/51 |
| 3,766,446 | 10/1973 | Tarui et al. | 357/58 |

FOREIGN PATENTS OR APPLICATIONS

| | | | |
|---|---|---|---|
| 1,176,088 | 1/1970 | United Kingdom | 357/13 |

Primary Examiner—Andrew J. James
Attorney, Agent, or Firm—Wolmar J. Stoffel

[57] ABSTRACT

A semiconductor resistor structure for providing a high value resistance particularly adapted for space charge limited transistor applications, the resistor being fabricated in a semiconductor body having a resistivity in excess of 1 ohm cm., more preferably in semiconductor material that is nearly intrinsic. The resistor has two parallel elongated surface diffused regions in the body of an impurity similar to the background impurity of the body and having a surface concentration sufficient to provide an ohmic contact, the boundaries of said surface diffused regions defined by the interface where the impurity concentration of the diffused region is ten percent more than the impurity concentration of the background impurity of the body. In a preferred embodiment, the surface diffused regions are spaced such that the boundaries intersect with each other, and ohmic contact terminals to each of the diffused regions.

10 Claims, 9 Drawing Figures

SEMICONDUCTOR RESISTOR HAVING A HIGH VALUE RESISTANCE FOR USE IN AN INTEGRATED CIRCUIT SEMICONDUCTOR DEVICE

CROSS-REFERENCE TO RELATED APPLICATIONS

This application is related to co-pending Application Ser. No. 209,233, filed Dec. 17, 1971 by Kanu Ashar et al. for "Microampere Space-Charged-Limited Transistor" and assigned to the same assignee as the present invention.

This application is also related to co-pending Application Ser. No. 428,165, filed Dec. 26, 1973, by I. E. Magdo et al. for "Space Charge Limited Transistor Having Recessed Dielectric Isolation" also assigned to the same assignee as the present invention.

This application is also related to co-pending Application Ser. No. 473,650, filed May 28, 1974, by S. Magdo for "Space Charge Limited Integrated Circuit Structure" also assigned to the present assignee.

FIELD OF THE INVENTION

The present invention relates to semiconductor resistors, more particularly to semiconductor resistor structures having high resistance values particularly applicable to circuits utilizing space charge limited transistors.

DESCRIPTION OF THE PRIOR ART

The above referenced application by Ashar et al. describes the basic space-charge-limited transistor, which essentially comprises a pair of lateral transistors formed in overlying relationship in a high resistivity substrate. The lower transistor is the lateral space charge limited transistor while the upper transistor is a parasitic lateral bipolar transistor. At zero base-emitter bias, both transistors are cut off. As the base emitter junction becomes increasingly forward biased, space charge limited current is initiated first in the lower transistor. As the forward bias increases to higher values, bipolar transistor action is also initiated in the upper transistor.

As discussed in the foregoing Magdo et al. co-pending patent application, Ser. No. 428,165, complementary space charge limited (SCL) transistors are very attractive for large scale integration. They can be fabricated with a minimum of processing steps, resulting in a consequent high yield; and they consume low power, resulting in the possibility of a high packing density within the semi-conductor substrate.

With space charge limited transistors, high current gains at low current levels can be obtained. It is a low current, low power device. In switching circuits embodying the SCL transistor, it is necessary therefor to have resistors having high resistive values in order to obtain the voltage swings necessary for proper operation.

In integrated circuit semiconductor applications, the fabrication of high resistance resistors presents problems. Conventional diffused resistors of the type illustrated in U.S. Pat. No. 3,629,667 when fabricated to provide high resistances would necessarily occupy a great deal of space on the device. This is objectionable. This type resistor when used as a high value resistance also would have relatively high capacitances. Another type resistor for obtaining relatively high resistances is an epitaxial resistor illustrated in IBM, TDB, Vol. 12, No. 1, June 1969, on page 19. A region of the epitaxial layer is electrically isolated and spaced ohmic contacts provided to channel current through the isolated region. However, such resistors require a great deal of device area, although less than the diffused resistor, and cannot be fabricated to obtain the necessary close tolerances. A third type of semiconductor resistor is known as the "pinch" resistor which is illustrated in IBM, TDB, Vol. 13, No. 8, January 1971, on page 2151. In this type of resistor, a region is provided between the spaced terminal of the resistor to direct the current downwardly across a constricted region. While such resistors can be used to obtain high resistances, the fabrication is relatively difficult and the resultant tolerances are in general poor.

The present problem facing the semiconductor industry is that in applications using SCL transistors in integrated circuit applications, no suitable high value resistor is known which meets all the requirements.

SUMMARY OF THE INVENTION

It is an object of this invention to provide a new high value resistor for integrated semiconductor devices.

Another object of this invention is to provide a new resistor for integrated semiconductor circuits that is compatible with space charge limited transistor technology.

These and other objects of the invention are obtained in a semiconductor resistor structure for integrated circuit applications which provides a high value resistance having a semiconductor region of high resistivity, at least two parallel elongated surface diffused regions in the body embodying a type impurity similar to the background impurity of the body with a surface concentration sufficient to obtain an ohmic contact, the boundaries of the surface diffused regions defined by the interface where the impurity concentration of the region is ten percent more than the impurity concentration of the background impurity, the diffused regions being spaced such that the boundaries thereof intersect with each other, and ohmic contact terminals to each of the diffused regions.

Another preferred specific embodiment of the high value resistor of the invention has two surface diffused regions in a high resistivity semiconductor body where the resistivity of the body is at least 5,000 ohm cm., the diffused regions spaced such that there is no intersection between the boundaries. This resistor displays a quadratic mode of operation.

DESCRIPTION OF PREFERRED EMBODIMENTS

Figure 1:
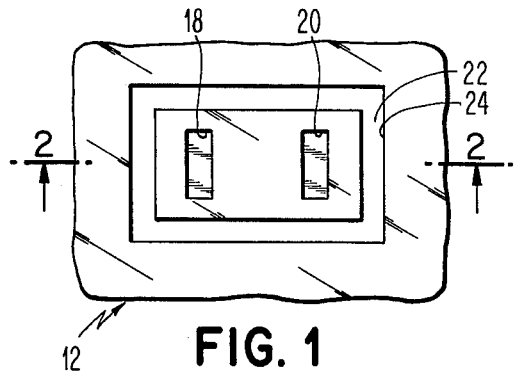
FIG. 1 is a top plan view illustrating a first embodiment of the resistor of the invention.
Figure 2:
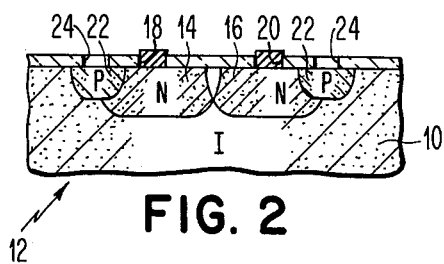
FIG. 2 is an elevational view taken on line 2—2 of FIG. 1.
Figure 6:
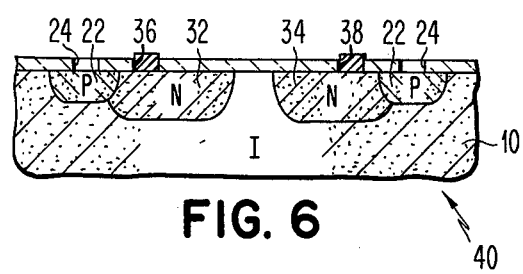
FIG. 6 is an elevational view taken on line 6—6 of FIG. 5.

Referring now to the drawings, FIGS. 1–8, respectively, there is illustrated a completely new kind of high value resistor that can be fabricated to produce resistors having resistances up to 100K ohms. These resistors are particularly useful in combination with spaced charge limited transistors. As illustrated in FIG. 2, the resistor is formed in semiconductor body 10 which is preferably nearly intrinsic monocrystalline silicon. The very important feature of the invention is that the resistor is formed in semiconductor material having a very high resistivity typically greater than 5K ohms cm. The resistor 12 is provided with two parallel elongated surface diffused regions 14 and 16 of a first type impurity for semiconductor materials. Since in high resistivity semiconductor materials, the boundary of a region is difficult to detect or define, it is arbitrarily decided that the boundary indicated in FIG. 2 represents the interface where there is a ten percent increase over the background impurity in the body. Suitable electrical contacts are made to regions 14 and 16 through openings 18 and 20. The impurity concentration for the terminals of the resistor must be of a concentration which will provide an ohmic contact. When an N-type impurity is used to form regions 14 and 16, the surface concentration in the vicinity of the electrical terminals must be on the order of $2 \times 10^{20}$ atoms/cc or higher. However, if the regions 14 and 16 are formed with a P-type impurity, the concentration must be $10^{17}$ atoms/cc or higher to obtain the ohmic contact. Regions 14 and 16 are formed by simultaneously diffusing an impurity into body 10 through openings 18 and 20 for a time sufficient to cause the boundaries 15 and 17 to intersect, as shown in FIG. 2. A suitable isolation zone 22 of an opposite type impurity is formed by diffusing a suitable impurity through an annular opening 24. Region 22 in combination with the high resistivity material of body 10 is sufficient to provide electrical isolation to isolate the subject resistor 12 from other elements on the device.

Figure 2A:
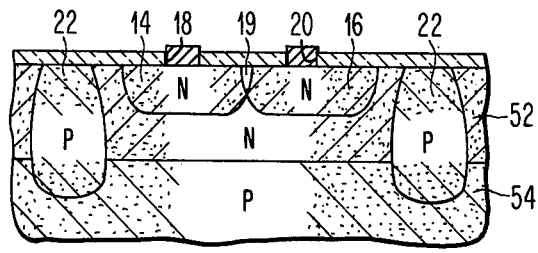
FIG. 2A is a modification of FIG. 2 adapted for bipolar transistor use.

The resistor 50 illustrated in FIG. 2A is similar to the resistor 12 shown in FIGS. 1 and 2 except that it is fabricated in a high resistivity epitaxial layer 52, preferably having a resistivity greater than 1 ohm cm. The layer 52 is deposited on monocrystalline substrate 54 by epitaxial deposition. Any suitable isolation structure can be used. Typically, isolation is achieved by P-type regions 22, formed by diffusing a P-type impurity into substrate 54 and subsequently depositing layer 52. The P-type impurity diffuses upwardly to the surface during epitaxial deposition of layer 52. This structure is readily adaptable to conventional bi-polar transistor technology.

Figure 3:
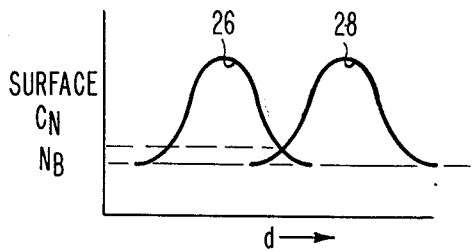
FIG. 3 is a graph of concentration versus distance which depicts the surface impurity concentration of the N-type impurity in the embodiment shown in FIG. 1 on the section of FIG. 2.

FIG. 3 depicts the surface concentrations of regions 14 and 16 of the resistor embodiment shown in FIG. 2. Note that at the intersection of regions 14 and 16, the impurity concentration is ten percent higher than the background impurity concentration of body 10. The impurity concentration in the overlapping area 19 above the intersection is more than ten percent higher than the background concentration; and reaches its maximum on the surface. This maximum should be preferably at least ten times higher than the background concentration to assure that the resistance does not depend on the background concentration.

Figure 4:
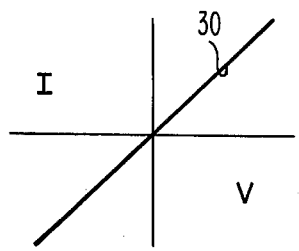
FIG. 4 is a graph of current versus voltage illustrating the operation of the resistor of FIG. 1.

FIG. 4 depicts the operating characteristics of the resistor 12. Note that curve 30 indicates that the resistor operation is linear.

Figure 5:
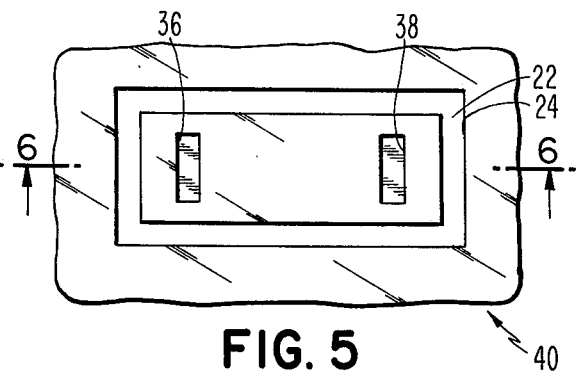
FIG. 5 is a top plan view of another embodiment of the resistor of the invention.

FIG. 5 depicts another embodiment 40 of the high value resistor of the invention. Resistor 40 is also fabricated in a high resistivity semiconductor body 10 and includes an isolation region 22 that surrounds diffused regions 32 and 34. Regions 32 and 34 are defined in FIG. 6 by depicting the boundary between the region in the background body as the interface wherein the impurity concentration of regions 32 and 34 is ten percent greater than the background impurity of body 10. Regions 32 and 34 are formed by surface diffusion of a suitable impurity through openings 36 and 38. In order that the current of the resistor to be space-charge-limited, and thus its resistance greatly independent of the resistivity variation of the substrate, the dielectric relaxation time has to be much longer than the carrier transit time in the high resistivity region 37 between the two N-type diffused regions. In practice, suitable metallurgy contacts are made to regions 32 and 34 through openings 36 and 38.

Figure 7:
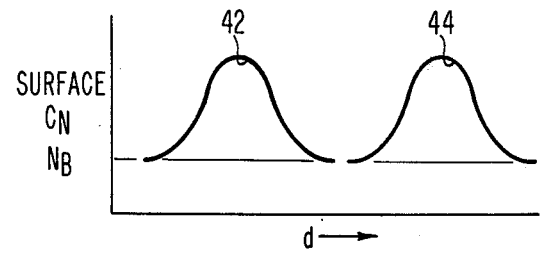
FIG. 7 is a graph of N-type surface impurity concentration versus distance taken on the section line shown in FIG. 6.

FIG. 7 depicts the surface concentration of regions 32 and 34 by curves 42 and 44. Note that the boundaries of regions 32 and 34 do not intersect as in device 12.

Figure 8:
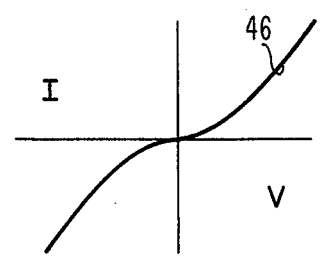
FIG. 8 is a graph of current versus voltage illustrating the operation of the embodiment shown in FIG. 5.

FIG. 8 depicts an operating curve 46 of the resistor 40. Note that the space-charge-limited current of the resistor obeys Matt-Gurney law and thus the current varies with the square of the applied voltage.

The following example is included to better able one skilled in the art to practice the invention and is not intended to unduly restrict the scope of the invention as defined in the claims.

EXAMPLE

An intrinsic monocrystalline silicon wafer was selected having a resistivity of 30K ohm cm. A thin layer of $SiO_2$ was formed on the surface of the wafer by thermal oxidation. The $SiO_2$ layer had a thickness of approximately 50 Angstroms. A blanket layer of $Si_3N_4$ was deposited on the surface of the $SiO_2$ layer by conventional techniques. A first layer of photoresist was spun on the wafer and a pattern exposed therein and developed. A series of resistor patterns were formed in the resist consisting of annular rectangular openings with spaced parallel elongated areas within the inner rectangular area as in FIG. 1 of the drawings. A series of three different dimensions were provided wherein the spacing of the areas within the rectangular was 5 micrometers, 3.75 micrometers, and 2.5 micrometers. The lengths of the openings were 6 micrometers in all cases. The elongated areas defined the ultimate diffusion windows for forming the diffused regions of the resistor. The $Si_3N_4$ layer and the underlying $SiO_2$ layer were removed outside the resistor pattern by conventional etching and the resultant exposed silicon oxidized in a steam environment. The resultant recessed oxide pattern extended into the silicon wafer approximately 3,000 Angstroms. The internal N regions of $Si_3N_4$ and $SiO_2$ surrounded by the recessed oxide were removed by conventional etching and photoresist techniques and an open tube $POCl_3$ diffusion made forming the regions of the resistor. The diffusion windows were then reoxidized and the remaining $Si_3N_4$ removed by dip etching. The annular isolation region was then formed by an open tube BBR3 diffusion. 2,500 Angstroms of pyrolytic $SiO_2$ were deposited on the surface, contact holes opened, and metallurgy formed for test purposes. The resultant resistors had a diffusion profile similar to device 12 i.e. the two spaced diffusions that intersected. The resistance of each of the series of resistors was measured and the results recorded. It was noted that the resistors with the diffusion windows spaced 5 micrometers had an average resistance of 20,000 ohms, the resistors with diffusion windows spaced 3.75 micrometers has an average resistance of 15,000 Angstroms and the third set of resistors with the diffusion windows spaced 2.5 micrometers had an average value of 10,000 ohms.

An analytic mathematical model of the diffused regions of the resistor was calculated which indicated that the diffused regions intersected each other, using the boundary as defined by a ten percent variation as described previously. It is impossible to determine the boundary as defined by any other method including staining.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A high value resistor element for use in a semiconductor integrated circuit device comprising:
   a semiconductor body
   a high resistivity region in said semiconductor body, with a resistivity in excess of one ohm cm. and a first type background impurity;
   at least two parallel elongated diffused regions in said high resistivity region of said semiconductor body extending inwardly from the surface, said diffused regions embodying a first type impurity, each having a central surface region with an impurity concentration sufficient to provide an ohmic contact, the boundaries of said surface diffused regions defined by the interface where the impurity concentration of the region is ten percent more than the impurity concentration of said first type background impurity, the impurity concentration in said diffused regions decreasing with distance in a radiating direction from the central surface region, said diffused regions being spaced such that said boundaries intersect with each other, and
   ohmic contact terminals to each of said diffused regions located over said central surface regions.

2. The semiconductor resistor structure of claim 1 wherein the resistivity of said high resistivity region is in excess of 5000 ohm cm.

3. The semiconductor resistor structure of claim 1 wherein said first type impurity is an N-type impurity, and the surface concentration of said central surface region is at least $2 \times 10^{20}$ atoms/cc.

4. The semiconductor resistor structure of claim 1 wherein said first type impurity is a P-type impurity, and the surface concentration of said central surface regions is at least $10^{17}$ atoms/cc.

5. The semiconductor resistor structure of claim 1 wherein said diffused regions are formed by diffusion windows with a spacing in the range of 2.5 to 10 $\mu$m.

6. The semiconductor resistor structure of claim 3 wherein said N-type impurity of said elongated diffused regions is phosphorous or arsenic.

7. A semiconductor resistor structure having a high resistance value for use in a semiconductor integrated circuit comprising:
   a semiconductor body
   a high resistivity region in said semiconductor body with a resistivity of at least 5000 ohm cm.;
   at least two parallel elongated diffused regions in said high resistivity region of said semiconductor body, said diffused regions embodying a first type impurity, each diffused region having a central surface region with an impurity concentration capable of providing an ohmic contact thereto, the boundaries of said surface diffused regions defined by the interface where the impurity concentration of the region is ten percent more than the impurity concentration of said first type background impurity, the impurity concentration in said diffused regions decreasing with distance in the radial direction from said central surface region, said diffused regions being spaced such that said boundaries of the respective regions are spaced, and
   ohmic contact terminals to each of said diffused regions located over said central surface region, the dielectric relaxation time being much longer than the carrier transit time in the high resistivity region of the substrate between the two diffused impurity regions.

8. The semiconductor resistor structure of claim 7 wherein said first type impurity is an N-type impurity, and the surface concentration of said central surface regions is at least $2 \times 10^{20}$.

9. The semiconductor resistor structure of claim 8 wherein there is provided an isolation means for isolating the resistor region from the adjacent regions of the body, said isolation means comprised of an annular surface diffused P-type region surrounding said ohmic contact terminals and said elongated diffused regions.

10. The semiconductor resistor structure of claim 7 wherein said semiconductor body is intrinsic silicon.

* * * * *